(12) United States Patent  (10) Patent No.: US 11,929,738 B2
Nomiya  (45) Date of Patent: Mar. 12, 2024

(54) ELECTRONIC DEVICE

(71) Applicant: Murata Manufacturing Co., Ltd., Nagaokakyo (JP)

(72) Inventor: Masato Nomiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 516 days.

(21) Appl. No.: 17/243,651

(22) Filed: Apr. 29, 2021

(65) Prior Publication Data

US 2021/0250016 A1 Aug. 12, 2021

Related U.S. Application Data

(63) Continuation of application No. PCT/JP2019/042737, filed on Oct. 31, 2019.

(30) Foreign Application Priority Data

Nov. 2, 2018 (JP) .................... 2018-207783

(51) Int. Cl.
H04B 1/10 (2006.01)
H01L 27/04 (2006.01)
H03H 9/64 (2006.01)
H03H 9/72 (2006.01)

(52) U.S. Cl.
CPC .......... *H03H 9/6489* (2013.01); *H01L 27/04* (2013.01); *H03H 9/725* (2013.01); *H04B 1/10* (2013.01)

(58) Field of Classification Search
None
See application file for complete search history.

(56) References Cited

U.S. PATENT DOCUMENTS

| | | | |
|---|---|---|---|
| 10,686,421 B2 * | 6/2020 | Nosaka | H04B 1/00 |
| 11,251,827 B2 * | 2/2022 | Seong | H03F 3/195 |
| 11,509,034 B2 * | 11/2022 | Seki | H04B 1/04 |
| 2003/0094679 A1 | 5/2003 | Asano et al. | |
| 2012/0326334 A1 | 12/2012 | Sakaguchi | |
| 2013/0069742 A1 | 3/2013 | Yasuda | |
| 2013/0329611 A1 | 12/2013 | Kitajima | |
| 2017/0179920 A1 | 6/2017 | Kawasaki | |
| 2017/0331458 A1 | 11/2017 | Tomita et al. | |

(Continued)

FOREIGN PATENT DOCUMENTS

| | | |
|---|---|---|
| JP | 2002-076810 A | 3/2002 |
| JP | 2003-204009 A | 7/2003 |

(Continued)

OTHER PUBLICATIONS

Official Communication issued in International Patent Application No. PCT/JP2019/042737, dated Jan. 28, 2020.

*Primary Examiner* — Jeffery S Zweizig

(74) *Attorney, Agent, or Firm* — Keating & Bennett, LLP

(57) ABSTRACT

An electronic component includes circuits that function independently of one another, and a switch electrically connected to the circuits. The electronic component includes a base body and two or more input/output terminals. The base body includes a main surface. The two or more input/output terminals are provided to the main surface of the base body, and include two first input/output terminals adjacent to each other. The switch changes one of the two first input/output terminals adjacent to each other to a hot terminal and changes the other to a ground terminal.

20 Claims, 10 Drawing Sheets

(56) References Cited

U.S. PATENT DOCUMENTS

2019/0214959 A1    7/2019   Nosaka
2019/0273521 A1    9/2019   Nishikawa

FOREIGN PATENT DOCUMENTS

| | | |
|---|---|---|
| JP | 2013-004881 A | 1/2013 |
| JP | 2017-118273 A | 6/2017 |
| JP | 2017-204761 A | 11/2017 |
| JP | 2018-006931 A | 1/2018 |
| JP | 2018-093475 A | 6/2018 |
| WO | 2010/143471 A1 | 12/2010 |
| WO | 2011/155235 A1 | 12/2011 |
| WO | 2012/117992 A1 | 9/2012 |
| WO | 2018/061782 A1 | 4/2018 |
| WO | 2018/123698 A1 | 7/2018 |

* cited by examiner

US 11,929,738 B2

ELECTRONIC DEVICE

CROSS REFERENCE TO RELATED APPLICATIONS

This application claims the benefit of priority to Japanese Patent Application No. 2018-207783 filed on Nov. 2, 2018 and is a Continuation Application of PCT Application No. PCT/JP2019/042737 filed on Oct. 31, 2019. The entire contents of each application are hereby incorporated herein by reference.

BACKGROUND OF THE INVENTION

1. Field of the Invention

The present invention generally relates to electronic devices and, in more detail, to electronic devices including electronic components.

2. Description of the Related Art

Electronic devices including electronic components have been known (see International Publication No. 2012/117992, for example). The electronic device described in International Publication No. 2012/117992 includes a surface acoustic wave (SAW) duplexer (electronic component). The SAW duplexer has a configuration in which a transmission signal input side port, a reception signal output side port, and an antenna side port are spaced apart from one another with predetermined distances, and ports for ground connection are located between the respective ports. As described above, by including the port for ground connection, interference between the two of the transmission signal input side port, the reception signal output side port, and the antenna side port may be suppressed, and high isolation may be ensured. In other words, the port for ground connection may suppress the mutual interference between the circuits connected to the respective ports. More specifically, the port for ground connection may suppress mutual interference between the circuit connected to the transmission signal input side port, the circuit connected to the reception signal output side port, and the circuit connected to the antenna side port.

SUMMARY OF THE INVENTION

As described above, the electronic device of the related art described in International Publication No. 2012/117992 is configured as follows. In the case that two hot terminals are adjacent to each other in the plurality of hot terminals (transmission signal input side port, reception signal output side port, and antenna side port), a ground terminal (port for ground connection) is provided between the two hot terminals in order to suppress mutual interference between the circuits connected to the two hot terminals.

However, the need for space to provide the ground terminal between the two hot terminals leads to a problem that the electronic component increases in size.

Preferred embodiments of the present invention provide electronic devices each capable of reducing the electronic components in size while reducing or preventing the interference between the circuits connected to the hot terminals.

An electronic device according to one aspect of a preferred embodiment of the present invention includes an electronic component and at least one switch. The electronic component includes a plurality of circuits that function independently of one another. The switch is electrically connected to the plurality of circuits. The electronic component includes a base body and two or more input/output terminals. The base body includes a main surface. The two or more input/output terminals are provided to the main surface of the base body. At least one of the two or more input/output terminals is electrically connected between corresponding one of the plurality of circuits and the switch. The two or more input/output terminals include two input/output terminals adjacent to each other. The two input/output terminals adjacent to each other are electrically connected between the switch and circuits different from each other among the plurality of circuits. The switch changes one of the two input/output terminals adjacent to each other to a hot terminal and changes the other of the two input/output terminals adjacent to each other to a ground terminal.

With an electronic device according to the above aspect of a preferred embodiment of the present invention, it is possible to reduce the electronic component in size while reducing or preventing the interference between the circuits connected to the hot terminals.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
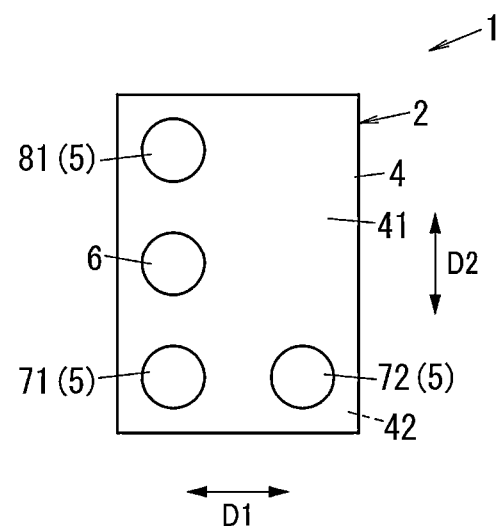
FIG. 1A is a bottom view of an electronic component in an electronic device according to Preferred Embodiment 1 of the present invention.

Hereinafter, electronic devices according to Preferred Embodiment 1 to Preferred Embodiment 6 will be described with reference to the drawings. FIG. 1A, FIG. 2, FIGS. 3A and 3B, FIGS. 5A and 5B, and FIGS. 6A and 6B, which are referred to in the following preferred embodiments and the like are schematic views, and the ratios of the sizes and thicknesses of the respective elements in the drawings do not necessarily reflect the actual dimensional ratios.

Preferred Embodiment 1

(1) Overall Configuration of Electronic Device

An overall configuration of an electronic device according to Preferred Embodiment 1 will be described with reference to the drawings.

Figure 1B:
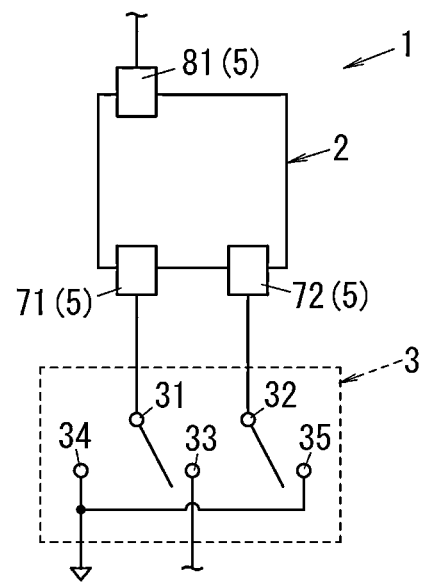
FIG. 1B is a schematic diagram of the electronic device described above.

An electronic device 1 includes an electronic component 2, a switch 3, and a wiring substrate 11 (see FIG. 2) as illustrated in FIGS. 1A and 1B. The electronic device 1 is used for radio frequency signal processing, for example, in the communication field.

The wiring substrate 11 may be a motherboard of the electronic device 1 or may be a wiring structure having a module structure, for example. The wiring substrate 11 is provided with a plurality of pads 12 (see FIG. 3B).

(2) Each Element of Electronic Device

Hereinafter, elements of the electronic device 1 will be described with reference to the drawings.

(2.1) Electronic Component

The electronic component 2 includes a plurality of circuits (not illustrated) that function independently of one another. The electronic component 2 includes a base body 4, three input/output terminals (external connection terminals) 5, and a ground terminal 6 as illustrated in FIG. 1A and FIG. 1B. The electronic component 2 is a filter or an integrated circuit (IC), for example. The electronic component 2 is mounted on the wiring substrate 11 (see FIG. 2).

(2.2) Base Body

The base body 4 has a rectangular plate shape, for example, and includes a first main surface 41 and a second main surface 42 as illustrated in FIG. 1A. The first main surface 41 includes a functional surface. The material of the base body 4 is silicon or a piezoelectric body, for example. The base body 4 is provided with a wiring layer (wiring portion) and a circuit element that define a plurality of circuits.

(2.3) Input/Output Terminal

The three input/output terminals 5 illustrated in FIG. 1A and FIG. 1B are connected to the plurality of respective circuits and are provided to the first main surface 41 of the base body 4. The three input/output terminals 5 include two first input/output terminals (two first external connection terminals) 71 and 72 and a second input/output terminal (second external connection terminal) 81.

The two first input/output terminals 71 and 72 are adjacent to each other. In more detail, the two first input/output terminals 71 and 72 are provided adjacent to each other in a first direction D1 on the first main surface 41 of the base body 4. The first input/output terminal 71 and the first input/output terminal 72 are electrically connected between the switch 3 and the circuits different from each other (circuits independent of each other) among the plurality of circuits (not illustrated) provided to the electronic component 2. That is, the first input/output terminal 71 and the first input/output terminal 72 are not electrically connected to each other. The first direction D1 is a direction orthogonal to the thickness direction of the base body 4.

In the present description, "the first input/output terminals 71 and 72 are adjacent to each other" means that the first input/output terminal 71 and the first input/output terminal 72 are adjacent to each other such that no other external connection terminal (ground terminal in particular) is present between the first input/output terminal 71 and the first input/output terminal 72.

The second input/output terminal 81 is provided side by side with the first input/output terminal 71 and the ground terminal 6 in a second direction D2 on the first main surface 41 of the base body 4. The second input/output terminal 81 is electrically connected to the first input/output terminals 71 and 72 via a plurality of circuits (not illustrated) provided to the electronic component 2 in the base body 4 or on the surface (first main surface 41) of the base body 4. The second direction D2 is a direction orthogonal to both of the thickness direction of the base body 4 and the first direction D1.

(2.4) Ground Terminal

The ground terminal 6 is provided between the first input/output terminal 71 and the second input/output terminal as illustrated in FIG. 1A. The ground terminal 6 is electrically connected to the ground. That is, the electric potential of the ground terminal 6 is a ground electric potential.

(3) Switch

The switch 3 is electrically connected to a plurality of circuits (not illustrated) provided to the electronic component 2 as illustrated in FIG. 1B. The switch 3 includes two common terminals 31 and 32, and three selection terminals 33, 34, and 35. The common terminal 31 is electrically connected to the first input/output terminal 71. The common terminal 32 is electrically connected to the first input/output terminal 72. The selection terminal 33 is electrically connected to another circuit (not illustrated). The selection terminals 34 and 35 are connected to the ground. The selection terminals 34 and 35 are connected to the same ground. In other words, all of the grounds, to which the two first input/output terminals 71 and 72 adjacent to each other are changed in the off state, are the same. In the present description, "in the off state" refers to a state when a circuit, to which the first input/output terminal is connected, is not used. Note that another circuit is a circuit different from the plurality of circuits provided to the electronic component 2 and is provided outside the electronic component 2.

The switch 3 selectively switches between a first state and a second state, which will be described later. The first state is a state in which the common terminal 31 is connected to the selection terminal 33 and the common terminal 32 is connected to the selection terminal 35. The second state is a state in which the common terminal 31 is connected to the selection terminal 34 and the common terminal 32 is connected to the selection terminal 33.

In the first state, since the common terminal 31 connected to the first input/output terminal 71 is connected to the selection terminal 33, the first input/output terminal 71 is in the on state and defines and functions as a hot terminal. Whereas, since the common terminal 32 connected to the first input/output terminal 72 is connected to the selection terminal 35, the first input/output terminal 72 is in the off state and defines and functions as the ground terminal. In the first state, the circuit among the plurality of circuits provided to the electronic component 2 that is electrically connected to the first input/output terminal 71 and another circuit electrically connected to the selection terminal 33 are electrically connected.

In the second state, since the common terminal 32 connected to the first input/output terminal 72 is connected to the selection terminal 33, the first input/output terminal 72 is in the on state and defines and functions as the hot terminal. Whereas, since the common terminal 31 connected to the first input/output terminal 71 is connected to the selection terminal 34, the first input/output terminal 71 is in the off state and defines and functions as the ground terminal. In the second state, the circuit among the plurality of circuits provided to the electronic component 2 that is electrically connected to the first input/output terminal 72 and another circuit electrically connected to the selection terminal 33 are electrically connected.

As described above, the switch 3 changes one of the two first input/output terminals 71 and 72 adjacent to each other to the hot terminal and changes the other of the two first input/output terminals 71 and 72 to the ground terminal. In other words, the switch 3 changes the two first input/output terminals 71 and 72 adjacent to each other to the hot terminal in the on state and to the ground terminal in the off state. In the present description, "in the on state" refers to a state when a circuit to which the first input/output terminal is connected is used, and "in the off state" refers to a state when a circuit to which the first input/output terminal is connected is not used.

The switch 3 is a separate body from the electronic component 2. The electronic component 2 is mounted on the wiring substrate 11 (see FIG. 2). For example, the switch 3 is provided to the wiring substrate 11, on which the electronic component 2 is provided, side by side with the electronic component 2.

In the present description, "the switch 3 is a separate body from the electronic component 2" means that the switch 3 is completely separated from the electronic component 2. For example, in a case that the switch 3 and the electronic component 2 are each formed or integrated into a chip, the state in which the chip of the switch 3 and the chip of the electronic component 2 are mounted on different positions of the wiring substrate 11 with solder or the like is the state in which "the switch 3 is a separate body from the electronic component 2". Also, the state in which "the chip of the switch 3 and the chip of the electronic component 2 are laminated" is also the state in which "the switch 3 is a separate body from the electronic component 2".

(4) Operation of Electronic Device

Hereinafter, the operation of the electronic device 1 will be described with reference to FIG. 1A and FIG. 1B. As illustrated in FIG. 1A, the two first input/output terminals 71 and 72 are arranged side by side and are adjacent to each other in the first direction D1.

When the first input/output terminal 71 is set to the hot terminal, the common terminal 31 is connected to the selection terminal 33 in the switch 3. With this, the first input/output terminal 71 defines and functions as the hot terminal. At this time, the common terminal 32 is connected to the selection terminal 35 in the switch 3. Since the selection terminal 35 is connected to the ground, the first input/output terminal 72 defines and functions as the ground terminal.

Whereas, when the first input/output terminal 72 is set to the hot terminal, the common terminal 32 is connected to the selection terminal 33 in the switch 3. With this, the first input/output terminal 72 defines and functions as the hot terminal. At this time, the common terminal 31 is connected to the selection terminal 34 in the switch 3. Since the selection terminal 34 is connected to the ground, the first input/output terminal 71 defines and functions as the ground terminal.

As described above, when one of the two first input/output terminals 71 and 72 adjacent to each other is set to the hot terminal, the other may be set to the ground terminal. That is, the state in which both of the two first input/output terminals 71 and 72 adjacent to each other are the hot terminals may be avoided.

(5) Effect

In the electronic device 1, the two first input/output terminals 71 and 72 adjacent to each other are changed to the hot terminal in the on state and are changed to the ground terminal in the off state. With this, one of the two first input/output terminals 71 and 72 adjacent to each other defines and functions as the ground terminal, and therefore, the state in which the hot terminals are adjacent to each other may be reduced even in a case that a dedicated ground terminal is not provided between the hot terminals adjacent to each other. In other words, the state in which both of the two first input/output terminals 71 and 72 become the hot terminals at the same time does not occur even in a case that the ground terminal is not provided between the two first input/output terminals 71 and 72 which may become the hot terminals, and therefore, the state in which the hot terminals are adjacent to each other may be reduced. As a result, the mutual interference between the circuits to which the hot terminals are connected may be reduced, and the electronic component 2 may be reduced in size in comparison with a case that the dedicated ground terminal is provided.

In the electronic device 1, the two first input/output terminals 71 and 72 adjacent to each other are connected to the same ground in the off state. With this, it is possible to design the electronic device 1 without considering the ground electric potential difference between the first input/output terminals 71 and 72 adjacent to each other.

(6) Modifications

Hereinafter, modifications of Preferred Embodiment 1 will be described.

In Preferred Embodiment 1, the number of the switches 3 is one, but the number thereof may be plural. In short, the electronic device 1 needs to include at least one switch 3.

For example, in a case that the number of switches 3 is two, the switch to change the first input/output terminal 71 to the hot terminal or to the ground terminal and the switch to change the first input/output terminal 72 to the hot terminal or to the ground terminal are individually provided. In this case, the two switches operate together such that the first input/output terminal 71 defines and functions as the hot terminal and the first input/output terminal 72 defines and functions as the ground terminal. Further, the two switches operate together such that the first input/output terminal 72 defines and functions as the hot terminal and the first input/output terminal 71 defines and functions as the ground terminal. In this case as well, when one of the two first input/output terminals 71 and 72 adjacent to each other is set to the hot terminal, the other may be set to the ground terminal. That is, the state in which both of the two first input/output terminals 71 and 72 adjacent to each other define and function as the hot terminals may be avoided.

In the electronic device 1 according to the modification of Preferred Embodiment 1, the switch 3 may not be a separate body from the electronic component 2, the functional surface of the electronic component 2 may be provided to the first main surface 41 of the base body 4, and the functional surface of the switch 3 may be provided to the second main surface 42 on the side opposite to the first main surface 41. For example, in a case that the electronic component 2 is an acoustic wave element, the switch 3 is provided to the surface on the side opposite to the functional surface of the silicon substrate (base body 4) of the acoustic wave element. In the present modification, two or more input/output terminals are terminals to electrically connect the functional surface of the plurality of circuits and the functional surface of the switch 3. The two or more input/output terminals are through-electrodes penetrating through the base body 4, for example. Alternatively, the two or more input/output terminals may not be through-electrodes but may be provided to a side surface of the base body 4. The side surface is the surface connecting the first main surface and the second main surface.

In the electronic device 1 according to another modification of Preferred Embodiment 1, the switch 3 may not be a separate body from the electronic component 2, and the switch 3 and the electronic component 2 may have a structure that is difficult to separate because of the circuit function. In more detail, the switch 3 may have a base body different from the base body 4 of the electronic component 2, but the switch 3 and the electronic component 2 may be arranged in a structure difficult to divide because of the circuit function. For example, there is a structure in which the base body of the switch 3, the functional surface of the switch 3, the base body 4 of the electronic component 2, and the functional surface of the electronic component 2 (functional surface of the plurality of circuits) are laminated in this order from a side of the wiring substrate 11 and the functional surface of the switch 3 is electrically connected to the functional surface of the electronic component 2 with the through-electrode.

Alternatively, there may be a structure in which the functional surface of the electronic component 2, the base body 4 of the electronic component 2, the functional surface of the switch 3, and the base body of the switch 3 are laminated in this order from the side of the wiring substrate 11 and the functional surface of the switch 3 is electrically connected to the functional surface of the electronic component 2 with the through-electrode. These structures have a structure in which the functional surface of the switch 3 and the functional surface of the plurality of circuits in the electronic component 2 are provided at different positions in the thickness direction of the base body 4 of the electronic component 2.

The electronic devices according to the modifications described above achieves the same effects as those of the electronic device 1 according to Preferred Embodiment 1.

Preferred Embodiment 2

Figure 2:
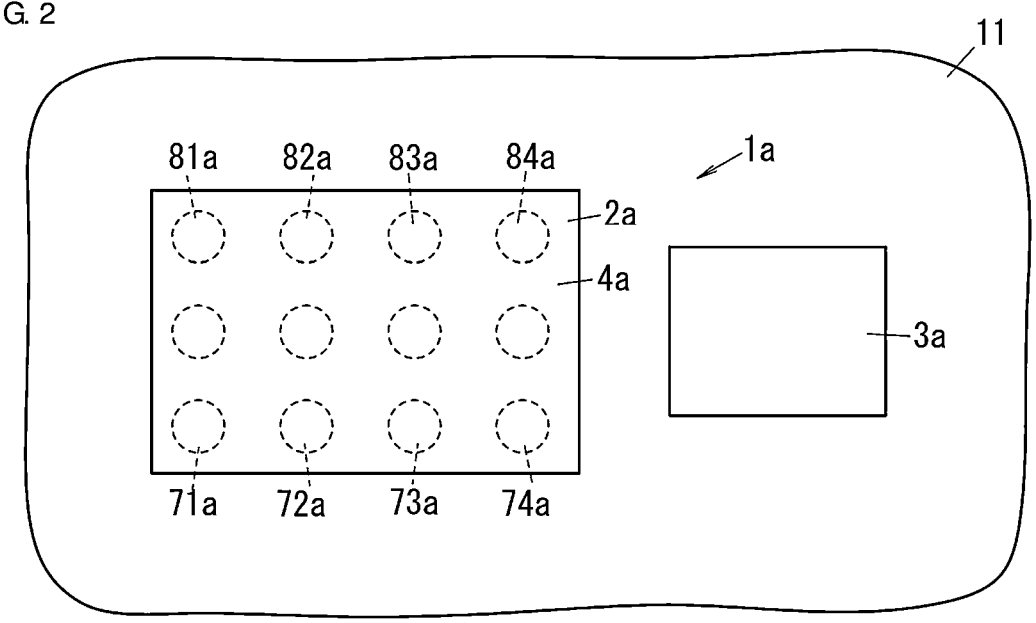
FIG. 2 is a front view of an electronic device according to Preferred Embodiment 2 of the present invention.

An electronic device 1a according to Preferred Embodiment 2 is different from the electronic device 1 according to Preferred Embodiment 1 (see FIG. 1B) in that four first input/output terminals 71a to 74a and four second input/output terminals 81a to 84a are provided to a base body 4a as illustrated in FIG. 2.

(1) Overall Configuration of Electronic Device

The electronic device 1a includes an electronic component 2a and a switch 3a as illustrated in FIG. 2. Note that, with respect to the electronic device 1a, the same elements as those of the electronic device 1 according to Preferred Embodiment 1 are denoted by the same reference numerals, and the description thereof will be omitted.

(2) Each Element of Electronic Device

Hereinafter, each element of the electronic device 1a will be described with reference to the drawings.

(2.1) Electronic Component

Figure 3A:
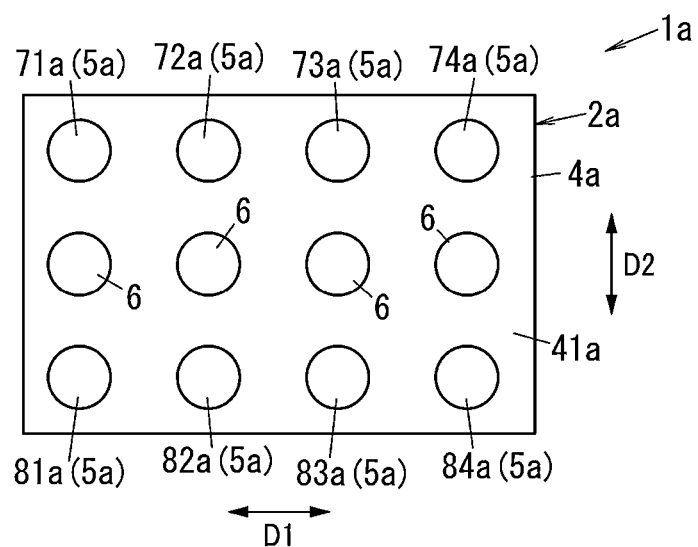
FIG. 3A is a bottom view of an electronic component in the electronic device described above.
Figure 3B:
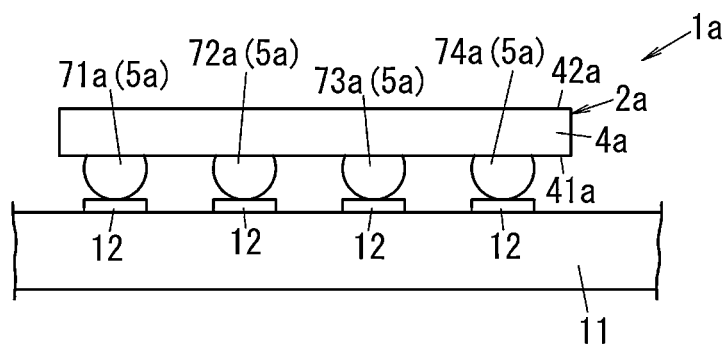
FIG. 3B is a side view of the electronic component in the electronic device described above.

The electronic component 2a includes the base body 4a, eight input/output terminals 5a, and the four ground terminals 6 as illustrated in FIGS. 3A and 3B. Note that, with respect to the electronic component 2a, the description of the same configurations and functions as those of the electronic component 2 of Preferred Embodiment 1 (see FIGS. 1A and 1B) will be omitted.

(2.2) Base Body

Similarly to the base body 4 of Preferred Embodiment 1, the base body 4a includes a first main surface 41a and a second main surface 42a as illustrated in FIGS. 3A and 3B. The first main surface 41a includes a functional surface.

(2.3) Input/Output Terminal

The eight input/output terminals 5a include the four first input/output terminals 71a to 74a and the four second input/output terminals 81a to 84a as illustrated in FIGS. 3A and 3B. In Preferred Embodiment 2, the four first input/output terminals 71a to 74a are input side terminals, and the four second input/output terminals 81a to 84a are output side terminals.

The four first input/output terminals 71a to 74a are adjacent to each other. In more detail, the four first input/output terminals 71a to 74a are adjacent to one another in the first direction D1. The four first input/output terminals 71a to 74a are provided on the first main surface 41a of the base body 4a such that no other external connection terminal (ground terminal in particular) is present between the two first input/output terminals adjacent to each other.

The four second input/output terminals 81a to 84a are adjacent to one another. In more detail, the four second input/output terminals 81a to 84a are adjacent to one another in the first direction D1. The four second input/output terminals 81a to 84a are provided on the first main surface 41a of the base body 4a such that no other external connection terminal (ground terminal in particular) is present between the two second input/output terminals adjacent to each other.

The four first input/output terminals 71a to 74a face the four second input/output terminals 81a to 84a across the ground terminal 6 in the second direction D2. The four first input/output terminals 71a to 74a are electrically connected to the four second input/output terminals 81a to 84a via a plurality of circuits (not illustrated) provided to the electronic component 2a. In more detail, the four first input/output terminals 71a to 74a correspond to the four second input/output terminals 81a to 84a on a one-to-one basis, and are electrically connected to the corresponding second input/output terminals 81a to 84a. Specifically, the first input/output terminal 71a is electrically connected to the second input/output terminal 81a, and the first input/output terminal 72a is electrically connected to the second input/output terminal 82a. The first input/output terminal 73a is electrically connected to the second input/output terminal 83a, and the first input/output terminal 74a is electrically connected to the second input/output terminal 84a.

(2.4) Ground Terminal

The four ground terminals 6 correspond to the four first input/output terminals 71a to 74a and the four second input/output terminals 81a to 84a on a one-to-one basis, and are provided between the corresponding first input/output terminals 71a to 74a and the corresponding second input/output terminals 81a to 84a in the second direction D2.

(3) Switch

Figure 4:
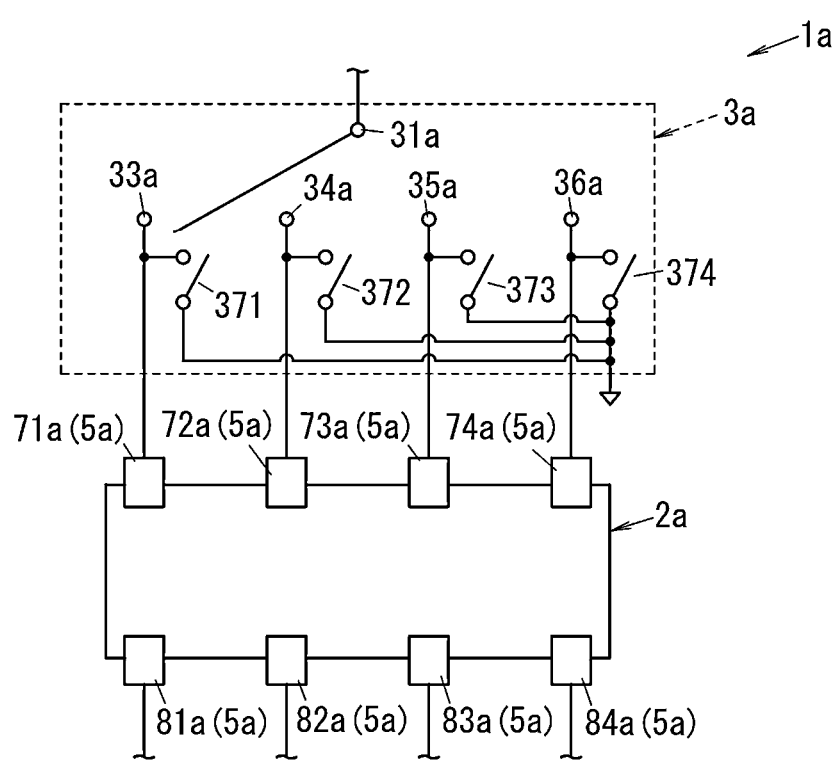
FIG. 4 is a schematic diagram of the electronic device described above.

The switch 3a is electrically connected to the electronic component 2a as illustrated in FIG. 4. The switch 3a includes a common terminal 31a, four selection terminals 33a to 36a, and four switching elements 371 to 374. The common terminal 31a is electrically connected to another circuit (not illustrated). The selection terminal 33a is electrically connected to the first input/output terminal 71a. Further, the selection terminal 33a is connected to the ground via the switching element 371. The selection terminal 34a is electrically connected to the first input/output terminal 72a. Further, the selection terminal 34a is connected to the ground via the switching element 372. The selection terminal 35a is electrically connected to the first input/output terminal 73a. Further, the selection terminal 35a is connected to the ground via the switching element 373. The selection terminal 36a is electrically connected to the first input/output terminal 74a. Further, the selection terminal 36a is connected to the ground via the switching element 374.

The switch 3a selectively switches between a first state, a second state, a third state, and a fourth state, which will be described later. The first state is the state in which the common terminal 31a is connected to the selection terminal 33a. The second state is the state in which the common terminal 31a is connected to the selection terminal 34a. The third state is the state in which the common terminal 31a is connected to the selection terminal 35a. The fourth state is the state in which the common terminal 31a is connected to the selection terminal 36a.

In the first state, since the common terminal 31a is connected to the selection terminal 33a connected to the first input/output terminal 71a, the first input/output terminal 71a is in the on state and defines and functions as a hot terminal. The switching element 371 is in the off state. Whereas, in the first state, the switching elements 372, 373, and 374 are in the on state. With this, the first input/output terminals 72a, 73a, and 74a are connected to the ground, and define and function as ground terminals. In the first state, the circuit among the plurality of circuits provided to the electronic component 2a that is electrically connected to the first input/output terminal 71a and another circuit electrically connected to the common terminal 31a are electrically connected.

In the second state, since the common terminal 31a is connected to the selection terminal 34a connected to the first input/output terminal 72a, the first input/output terminal 72a is in the on state and defines and functions as the hot terminal. The switching element 372 is in the off state. Whereas, in the second state, the switching elements 371, 373, and 374 are in the on state. With this, the first input/output terminals 71a, 73a, and 74a are connected to the ground, and define and function as the ground terminals. In the second state, the circuit among the plurality of circuits provided to the electronic component 2a that is electrically connected to the first input/output terminal 72a and another circuit electrically connected to the common terminal 31a are electrically connected.

In the third state, since the common terminal 31a is connected to the selection terminal 35a connected to the first input/output terminal 73a, the first input/output terminal 73a is in the on state and defines and functions as the hot terminal. The switching element 373 is in the off state. Whereas, in the third state, the switching elements 371, 372, and 374 are in the on state. With this, the first input/output terminals 71a, 72a, and 74a are connected to the ground, and define and function as the ground terminals. In the third state, the circuit among the plurality of circuits provided to the electronic component 2a that is electrically connected to the first input/output terminal 73a and another circuit electrically connected to the common terminal 31a are electrically connected.

In the fourth state, since the common terminal 31a is connected to the selection terminal 36a connected to the first input/output terminal 74a, the first input/output terminal 74a is in the on state and defines and functions as the hot terminal. The switching element 374 is in the off state. Whereas, in the fourth state, the switching elements 371, 372, and 373 are in the on state. With this, the first input/output terminals 71a, 72a, and 73a are connected to the ground, and define and function as the ground terminals. In the fourth state, the circuit among the plurality of circuits provided to the electronic component 2a that is electrically connected to the first input/output terminal 74a and another circuit electrically connected to the common terminal 31a are electrically connected.

As described above, the switch 3a changes one of the four first input/output terminals 71a to 74a adjacent to one another to the hot terminal, and changes the remainder to the ground terminals.

(4) Operation of Electronic Device

Hereinafter, the operation of the electronic device 1a will be described with reference to FIG. 3A and FIG. 4. The four first input/output terminals 71a to 74a are arranged side by side and are adjacent to each other in the first direction D1 without other external connection terminal in-between as illustrated in FIG. 3A.

When the first input/output terminal 71a is set to the hot terminal, the common terminal 31a is connected to the selection terminal 33a in the switch 3a. At this time, the switching element 371 is in the off state. Whereas, the switching elements 372, 373, and 374 are in the on state. With this, the first input/output terminal 71a defines and functions as the hot terminal, and the first input/output terminals 72a, 73a, and 74a define and function as the ground terminals.

When the first input/output terminal 72a is set to the hot terminal, the common terminal 31a is connected to the selection terminal 34a in the switch 3a. At this time, the switching element 372 is in the off state. Whereas, the switching elements 371, 373, and 374 are in the on state. With this, the first input/output terminal 72a defines and functions as the hot terminal, and the first input/output terminals 71a, 73a, and 74a define and function as the ground terminals.

When the first input/output terminal 73a is set to the hot terminal, the common terminal 31a is connected to the selection terminal 35a in the switch 3a. At this time, the switching element 373 is in the off state. Whereas, the switching elements 371, 372, and 374 are in the on state. With this, the first input/output terminal 73a defines and functions as the hot terminal, and the first input/output terminals 71a, 72a, and 74a define and function as the ground terminals.

When the first input/output terminal 74a is set to the hot terminal, the common terminal 31a is connected to the selection terminal 36a in the switch 3a. At this time, the switching element 374 is in the off state. Whereas, the switching elements 371, 372, and 373 are in the on state. With this, the first input/output terminal 74a defines and functions as the hot terminal, and the first input/output terminals 71a, 72a, and 73a define and function as the ground terminals.

As described above, when any one of the four first input/output terminals 71a to 74a adjacent to each other defines and functions as the hot terminal, the remainder may be set to the ground terminals. That is, it is possible to avoid the state in which both of the two first input/output terminals adjacent to each other among the four first input/output terminals 71a to 74a adjacent to one another are the hot terminals.

(5) Effect

Also in the electronic device 1a according to Preferred Embodiment 2, similarly to the electronic device 1 according to Preferred Embodiment 1, the four first input/output terminals 71a to 74a adjacent to one another are changed to the hot terminal in the on state and are changed to the ground terminal in the off state. With this, similarly to Preferred Embodiment 1, at least one of the four first input/output terminals 71a to 74a adjacent to each other defines and functions as the ground terminal, and therefore, the state in which the hot terminals are adjacent to each other may be reduced even in a case that a dedicated ground terminal is not provided between the hot terminals adjacent to each other. As a result, the mutual interference between the circuits to which the hot terminals are connected may be reduced, and the electronic component 2a may be reduced in size in comparison with a case that the dedicated ground terminal is provided.

Preferred Embodiment 3

Figure 5A:
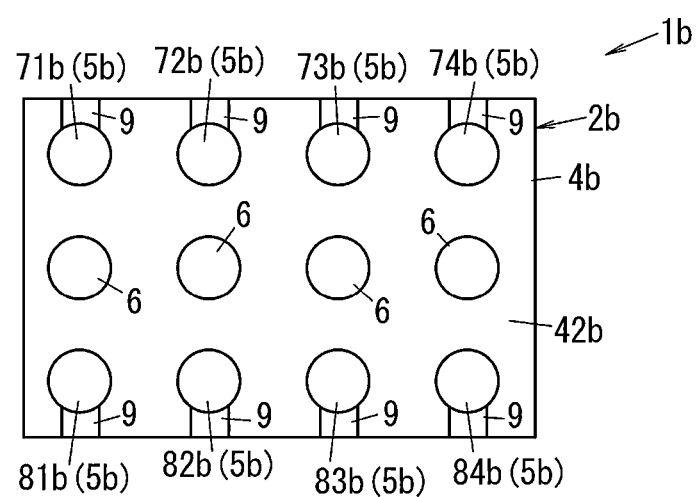
FIG. 5A is a bottom view of an electronic component in an electronic device according to Preferred Embodiment 3 of the present invention.
Figure 5B:
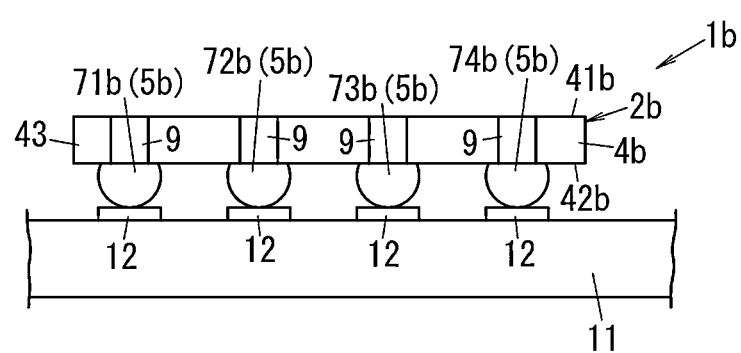
FIG. 5B is a side view of the electronic component in the electronic device described above.

An electronic device 1b according to Preferred Embodiment 3 is different from the electronic device 1a according to Preferred Embodiment 2 (see FIGS. 3A and 3B) in that eight input/output terminals 5b are provided to a second main surface 42b of a base body 4b and a plurality of (eight in illustrated example) electrical connection portions 9 are provided to a side surface 43 of the base body 4b as illustrated in FIGS. 5A and 5B.

The electronic device 1b includes, as illustrated in FIGS. 5A and 5B, an electronic component 2b and the switch 3a (see FIG. 4). The electronic device 1b is mounted on the wiring substrate 11. Note that, with respect to the electronic device 1b, the same elements as those of the electronic device 1a according to Preferred Embodiment 2 are denoted by the same reference numerals, and the description thereof will be omitted.

The electronic component 2b includes the base body 4b, the eight input/output terminals 5b, and four ground terminals 6 as illustrated in FIGS. 5A and 5B. The electronic component 2b further includes the plurality of (eight in illustrated example) electrical connection portions 9. Note that, with respect to the electronic component 2b, the description of the same configurations and functions as those of the electronic component 2a of Preferred Embodiment 2 (see FIGS. 3A and 3B) will be omitted.

The base body 4b includes a first main surface 41b, the second main surface 42b, and the side surface 43. The first main surface 41b has a functional surface of a plurality of circuits (not illustrated). The second main surface 42b is the main surface on the side opposite to the functional surface. The side surface 43 is the surface connecting the first main surface 41b and the second main surface 42b.

The electronic component 2b is provided with the eight input/output terminals 5b on the second main surface 42b. That is, the main surface on which the eight input/output terminals 5b are provided is the second main surface 42b.

The plurality of electrical connection portions 9 passes through the side surface 43, electrically connects the functional surface of the first main surface 41b and four first input/output terminals 71b to 74b, and electrically connects the functional surface of the first main surface 41b and four second input/output terminals 81b to 84b as illustrated in FIGS. 5A and 5B.

Note that, since the operation of the electronic device 1b is the same as the operation of the electronic device 1a according to Preferred Embodiment 2, a description thereof will be omitted.

In the electronic device 1b described above, the base body 4b is provided with the eight input/output terminals 5b on the second main surface 42b on the side opposite to the first main surface 41b including the functional surface. With this, the wiring efficiency may be improved even in the second main surface 42b in which a connection portion having a size larger than the functional surface portion, such as solder, needs to be provided.

In the electronic device 1b, among the plurality of electrical connection portions 9 connected to a plurality of circuits (not illustrated) provided to the electronic component 2b, the plurality of electrical connection portions 9 is disposed on the side surface 43 of the base body 4b such that one side of the two electrical connection portions 9 adjacent to each other functions as the ground electrode. With this, wiring efficiency may be improved even in the side surface 43 being a limited region of the base body 4b, and therefore, it is possible to improve the wiring lines number efficiency including a stationary ground (electrode that always has ground potential).

As a modification of Preferred Embodiment 3, in a case that the plurality of circuits (not illustrated) provided to the electronic component 2b is placed on the first main surface 41b, a structure electrically connected between the first main surface 41b and the second main surface 42b such that the input/output terminal 5b, which forms a solder bump or the like, is disposed on the second main surface 42b, may be applied. The structure electrically connected between the first main surface 41b and the second main surface 42b may define an electrode to penetrate through the base body 4b, or may connect the plurality of circuits on the first main surface 41b and the input/output terminal 5b on the second main surface 42b with a metal wire or the like, for example.

Further, as another modification of Preferred Embodiment 3, the electronic device 1b may be configured as follows. The functional surface of the electronic component 2b is provided to the first main surface 41b of the base body 4b, and the functional surface of the switch 3a is provided to the second main surface 42b on the side opposite to the first main surface 41b. For example, in a case that the electronic component 2b is an acoustic wave element, the switch 3a is provided to the surface on the side opposite to the functional surface in a silicon substrate (base body 4b) of the acoustic wave element. In the case of the modification above, the two or more input/output terminals are the terminals in which the functional surface of the plurality of circuits and the functional surface of the switch 3a are electrically connected. The two or more input/output terminals are through-electrodes that penetrate through the base body 4b, for example. Alternatively, the two or more input/output terminals may not be the through-electrode, but may be provided to the side surface of the base body 4b. In this case, the two or more input/output terminals are the electrical connection portions 9 provided to the side surface 43.

The electronic device 1b according to each of the above-described modifications also achieves the same effects as those of the electronic device 1b according to Preferred Embodiment 3.

Preferred Embodiment 4

Figure 6A:
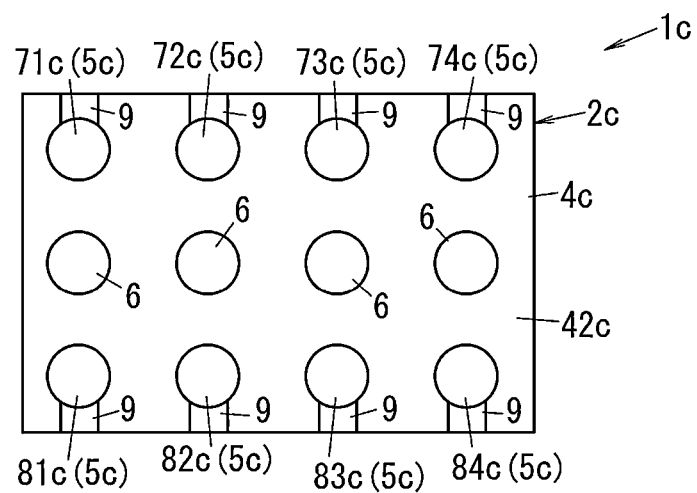
FIG. 6A is a bottom view of an electronic component in an electronic device according to Preferred Embodiment 4 of the present invention.
Figure 6B:
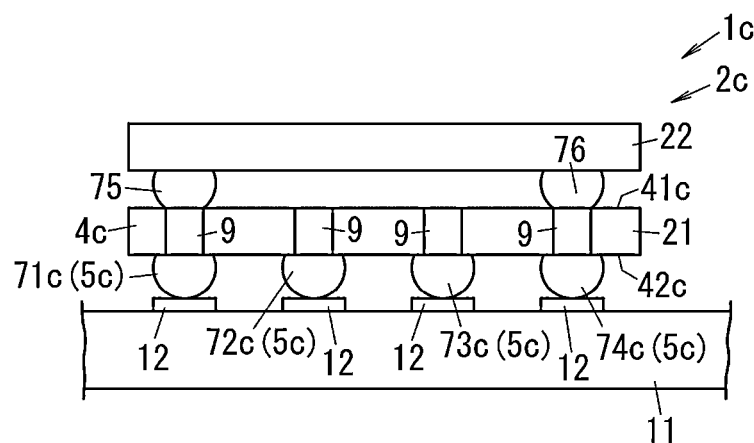
FIG. 6B is a side view of the electronic component in the electronic device described above.

An electronic device 1c according to Preferred Embodiment 4 is different from the electronic device 1b according to Preferred Embodiment 3 (see FIGS. 5A and 5B) in that a plurality of chips (first chip 21 and second chip 22) are laminated in an electronic component 2c as illustrated in FIGS. 6A and 6B.

The electronic device 1c includes an electronic component 2c as illustrated in FIGS. 6A and 6B, instead of the electronic component 2b of Preferred Embodiment 3. Note that, with respect to the electronic device 1c, the same elements as those of the electronic device 1b according to Preferred Embodiment 3 are denoted by the same reference numerals, and the description thereof will be omitted.

The electronic component 2c includes the first chip 21 and the second chip 22 laminated in a thickness direction of a base body 4c. The first chip 21 and the second chip 22 are electrically connected with bumps 75 and 76. Note that, with respect to the electronic component 2c, the description of the same configurations and functions as those of the electronic component 2b of Preferred Embodiment 3 (see FIGS. 5A and 5B) will be omitted.

The first chip 21 includes the base body 4c, four first input/output terminals 71c to 74c, and four second input/output terminals 81c to 84c. At least, the first chip 21 has a plurality of functions. When the electronic device 1c executes the plurality of functions at the same time, the respective circuits in the plurality of circuits that is switched by the switch 3a (see FIG. 4) are paired using a first wiring portion provided to the first chip 21 and a second wiring portion provided to the second chip 22. Each of the plurality of circuits used at the same time includes the first wiring portion and the second wiring portion. Further, at least the first wiring portion provided to the first chip 21 and the second wiring portion provided to the second chip 22 are disposed adjacent to each other. That is, the paired first wiring portion and second wiring portion are disposed adjacent to each other. The first input/output terminals 71c and 74c are electrically connected to the second wiring portion provided to the second chip 22. In other words, the first wiring portion provided to the first chip 21 and connected to the first input/output terminal 71c is electrically connected to the second wiring portion provided to the second chip 22 and connected to the bump 75. The first wiring portion provided to the first chip 21 and connected to the first input/output terminal 74c is electrically connected to the second wiring portion provided to the second chip 22 and connected to the bump 76.

Meanwhile, the plurality of circuits relating to the plurality of functions to be simultaneously executed is disposed in an outer end side of the first chip 21 and the second chip 22. In more detail, the first wiring portion provided to the first chip 21 is disposed on the outer end side of the first chip 21, and the second wiring portion provided to the second chip 22 is disposed on the outer end side of the second chip 22. That is, the two first input/output terminals 71c and 74c that define and function as hot terminals at the same time among the four input/output terminals 5c are provided at the outer end of a second main surface 42c of the base body 4c. The two first input/output terminals 71c and 74c, which define and function as the hot terminals at the same time, are spaced apart from each other. Similarly to the base body 4b of Preferred Embodiment 3, the base body 4c includes a first main surface 41c and the second main surface 42c opposing to each other in the thickness direction of the base body 4c.

In the electronic device 1c described above, the two first input/output terminals 71c and 74c that simultaneously define and function as the hot terminals, that is, the two first input/output terminals 71c and 74c that are simultaneously used are positioned at the outer end of the second main surface 42c of the base body 4c (spaced apart from each other). This makes it possible to reduce the mutual influence on the characteristics of the two circuits even when the two circuits are simultaneously used (when two functions are simultaneously performed).

In the electronic device 1c, the two circuits relating to the two functions are spaced apart from each other in the first chip 21 and the second chip 22. With this, in a case that each circuit has the first wiring portion and the second wiring portion, when one of the two functions is performed at a time, preferable isolation may be ensured in the two circuits that are simultaneously used (two functions that are simultaneously performed).

Preferred Embodiment 5

Figure 7:
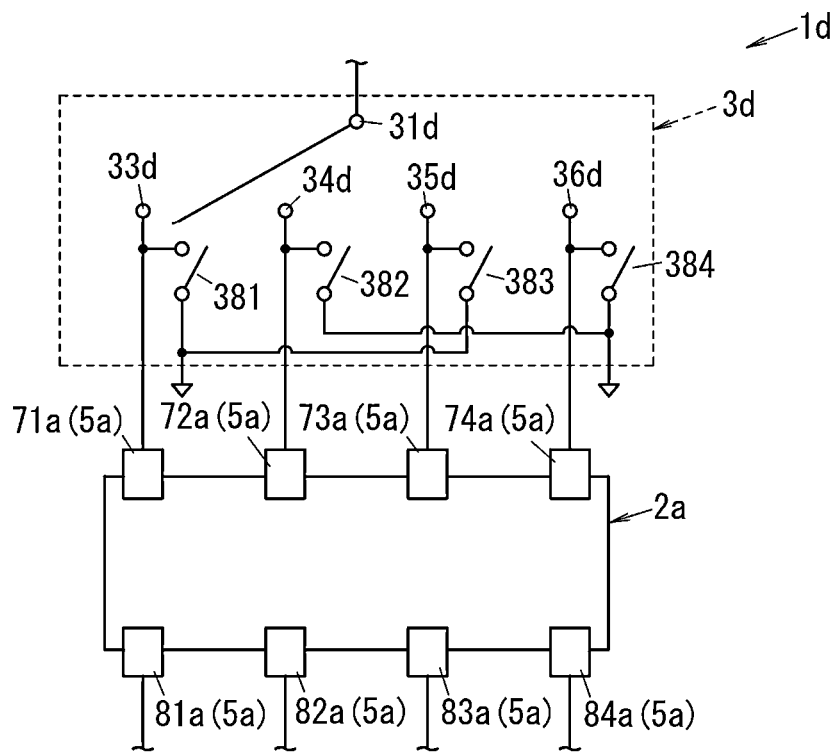
FIG. 7 is a schematic diagram of an electronic component in an electronic device according to Preferred Embodiment 5 of the present invention.

An electronic device 1d according to Preferred Embodiment 5 is different from the electronic device 1a according to Preferred Embodiment 2 (see FIG. 4) in that two types of grounds are provided as illustrated in FIG. 7. Note that, with respect to the electronic device 1d, the same elements as those of the electronic device 1a according to Preferred Embodiment 2 are denoted by the same reference numerals, and the description thereof will be omitted.

The electronic device 1d includes the electronic component 2a and a switch 3d as illustrated in FIG. 7. Note that the electronic component 2a according to Preferred Embodiment 5 is a component having the same function as that of the electronic component 2a according to Preferred Embodiment 2, and a description thereof will be omitted.

The switch 3d is electrically connected to the electronic component 2a as illustrated in FIG. 7. The switch 3d includes a common terminal 31d, four selection terminals 33d to 36d, and four switching elements 381 to 384. The common terminal 31d is electrically connected to another circuit (not illustrated). The selection terminal 33d is electrically connected to the first input/output terminal 71a. Further, the selection terminal 33d is connected to the ground via the switching element 381. The selection terminal 34d is electrically connected to the first input/output terminal 72a. Further, the selection terminal 34d is connected to the ground via the switching element 382. The selection terminal 35d is electrically connected to the first input/output terminal 73a. Further, the selection terminal 35d is connected to the ground via the switching element 383. The selection terminal 36d is electrically connected to the first input/output terminal 74a. Further, the selection terminal 36d is connected to the ground via the switching element 384.

In Preferred Embodiment 5, the ground to which the selection terminals 33d and 35d are connected via the switching element 381 and 383 and the ground to which the selection terminals 34d and 36d are connected via the switching element 382 and 384 are not the same, and are different from each other.

From the above, the ground to which the first input/output terminals 71a and 73a, which are part of the four first input/output terminals 71a to 74a adjacent to one another, are switched in the off state is different from the ground to which the first input/output terminals 72a and 74a, which are the remainder of the four first input/output terminals 71a to 74a adjacent to each other are switched in the off state. In the example in FIG. 7, with respect to the first input/output terminals 71a and 72a adjacent to each other, the ground to which the first input/output terminal 71a is switched in the off state is different from the ground to which the first input/output terminal 72a is switched in the off state. With respect to the first input/output terminals 72a and 73a adjacent to each other, the ground to which the first input/output terminal 72a is switched in the off state is different from the ground to which the first input/output terminal 73a is switched in the off state. With respect to the first input/output terminals 73a and 74a adjacent to each other, the ground to which the first input/output terminal 73a is switched in the off state is different from the ground to which the first input/output terminal 74a is switched in the off state.

Note that, since the operation of the electronic device 1d is the same as the operation of the electronic device 1a according to Preferred Embodiment 2, a description thereof will be omitted. However, as described above, the ground to which the first input/output terminals 71a and 73a are switched in the off state is different from the ground to which the first input/output terminals 72a and 74a are switched in the off state.

In the electronic device 1d, the different grounds are assigned in accordance with the first input/output terminals 71a to 74a, and therefore, it is possible to reduce the migration of signal components or the like via the ground even in a case that the ground design is fragile.

Preferred Embodiment 6

Figure 8:
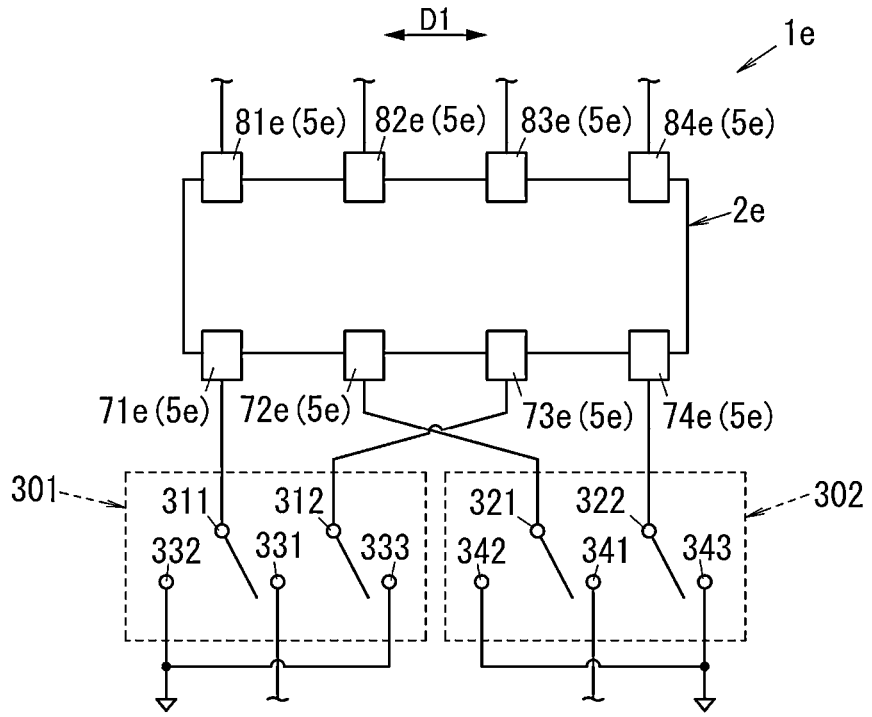
FIG. 8 is a schematic diagram of an electronic component in an electronic device according to Preferred Embodiment 6 of the present invention.

An electronic device 1e according to Preferred Embodiment 6 is different from the electronic device 1a according to Preferred Embodiment 2 (see FIG. 4) in that two switches (first switch 301 and second switch 302) are provided as illustrated in FIG. 8.

The electronic device 1e includes an electronic component 2e, the first switch 301, and the second switch 302 as illustrated in FIG. 8. Note that, with respect to the electronic device 1e, the same elements as those of the electronic device 1a according to Preferred Embodiment 2 are denoted by the same reference numerals, and the description thereof will be omitted.

The electronic component 2e includes eight input/output terminals 5e as illustrated in FIG. 8. Similarly to the electronic component 2a of Preferred Embodiment 2, the electronic component 2e further includes the base body 4a (see FIG. 3A) and four ground terminals 6 (see FIG. 3A). Note that, with respect to the electronic component 2e, the description of the same configurations and functions as those of the electronic component 2a of Preferred Embodiment 2 (see FIG. 4) will be omitted.

The eight input/output terminals 5e include four first input/output terminals 71e to 74e and four second input/output terminals 81e to 84e as illustrated in FIG. 8. The four first input/output terminals 71e to 74e are adjacent to one another in the first direction D1. Similarly, the four second input/output terminals 81e to 84e are adjacent to one another in the first direction D1. In Preferred Embodiment 5, the four first input/output terminals 71e to 74e are output side terminals, and the four second input/output terminals 81e to 84e are input side terminals.

The electronic component 2e includes, as the four first input/output terminals 71e to 74e adjacent to one another, the first input/output terminals 71e and 73e of a first group and the first input/output terminals 72e and 74e of a second group. Note that, with respect to the first input/output terminals 71e to 74e, the description of the same configurations and functions as those of the first input/output terminals 71a to 74a of Preferred Embodiment 2 (see FIG. 4) will be omitted.

As described above, the electronic device 1e includes the first switch 301 and the second switch 302 as a switch. In Preferred Embodiment 6, the first switch 301 is different from the second switch 302. Note that, with respect to the first switch 301 and the second switch 302, the description of the same configurations and functions as those of the switch 3a of Preferred Embodiment 2 (see FIG. 4) will be omitted.

The first switch 301 changes each of the first input/output terminals 71e and 73e of the first group to a hot terminal or a ground terminal. In more detail, the first switch 301 is electrically connected to the first input/output terminals 71e and 73e of the electronic component 2e. The first switch 301 includes two common terminals 311 and 312, and three selection terminals 331 to 333. The common terminal 311 is electrically connected to the first input/output terminal 71e. The common terminal 312 is electrically connected to the first input/output terminal 73e. The selection terminal 331 is electrically connected to another circuit (not illustrated). The selection terminals 332 and 333 are connected to the ground.

The second switch 302 changes each of the first input/output terminals 72e and 74e of the second group to the hot terminal or the ground terminal. In more detail, the second switch 302 is electrically connected to the first input/output terminals 72e and 74e of the electronic component 2e. The second switch 302 includes two common terminals 321 and 322, and three selection terminals 341 to 343. The common terminal 321 is electrically connected to the first input/output terminal 72e. The common terminal 322 is electrically connected to the first input/output terminal 74e. The selection terminal 341 is electrically connected to another circuit (not illustrated). The selection terminals 342 and 343 are connected to the ground.

The first switch 301 and the second switch 302 operate such that two adjacent first input/output terminals among the four first input/output terminals 71e to 74e do not change to the hot terminals at the same time.

Hereinafter, the operation of the electronic device 1e will be described with reference to FIG. 8. The four first input/output terminals 71e to 74e are adjacent to one another in the first direction D1 without other external connection terminal in-between as illustrated in FIG. 8.

When the first input/output terminal 71e is set to the hot terminal, the first switch 301 connects the common terminal 311 to the selection terminal 331, and connects the common terminal 312 to the selection terminal 333. In this case, the second switch 302 connects the common terminal 321 to the selection terminal 342, and connects the common terminal 322 to the selection terminal 343. With this, the first input/output terminal 71e defines and functions as the hot terminal, and the first input/output terminals 72e, 73e, and 74e define and function as the ground terminals.

Here, the second switch 302 may connect the common terminal 322 to the selection terminal 341. In this case, not only the first input/output terminal 71e, but also the first input/output terminal 74e define and function as the hot terminals. Both of the first input/output terminal 72e adjacent to the first input/output terminal 71e and the first input/output terminal 73e adjacent to the first input/output terminal 74e define and function as the ground terminals.

When the first input/output terminal 72e is set to the hot terminal, the second switch 302 connects the common terminal 321 to the selection terminal 341, and connects the common terminal 322 to the selection terminal 343. In this case, the first switch 301 connects the common terminal 311 to the selection terminal 332, and connects the common terminal 312 to the selection terminal 333. With this, the first input/output terminal 72e defines and functions as the hot terminal, and the first input/output terminals 71e, 73e, and 74e define and function as the ground terminals.

When the first input/output terminal 73e is set to the hot terminal, the first switch 301 connects the common terminal 312 to the selection terminal 331, and connects the common terminal 311 to the selection terminal 332. In this case, the second switch 302 connects the common terminal 321 to the selection terminal 342, and connects the common terminal 322 to the selection terminal 343. With this, the first input/output terminal 73e defines and functions as the hot terminal, and the first input/output terminals 71e, 72e, and 74e define and function as the ground terminals.

When the first input/output terminal 74e is set to the hot terminal, the second switch 302 connects the common terminal 322 to the selection terminal 341, and connects the common terminal 321 to the selection terminal 342. In this case, the first switch 301 connects the common terminal 311 to the selection terminal 332, and connects the common terminal 312 to the selection terminal 333. With this, the first input/output terminal 74e defines and functions as the hot terminal, and the first input/output terminals 71e, 72e, and 73e define and function as the ground terminals.

Here, the first switch 301 may connect the common terminal 311 to the selection terminal 331. In this case, not only the first input/output terminal 74e, but also the first input/output terminal 71e define and function as the hot terminals. Both of the first input/output terminal 72e adjacent to the first input/output terminal 71e and the first input/output terminal 73e adjacent to the first input/output terminal 74e define and function as the ground terminals.

As described above, when any one of the four first input/output terminals 71e to 74e adjacent to one another defines and functions as the hot terminal, the remainder may be set to the ground terminals. That is, it is possible to avoid the state in which both of the two first input/output terminals adjacent to each other among the four first input/output terminals 71e to 74e adjacent to each other are the hot terminals.

In the electronic device 1e, dividing the switches connected to the first input/output terminals 71e to 74e adjacent to one another into the first switch 301 and the second switch 302 makes it possible to improve the electrical isolation degree between the first input/output terminals 71e to 74e adjacent to one another.

In the electronic device 1e, it is possible to avoid a state in which the first input/output terminals 71e to 74e, likely to be used as the hot terminals at the same time, are adjacent to one another. With this, the effect of using a portion of the first input/output terminals 71e to 74e as the ground terminal is further exhibited. In addition to that, connecting the first input/output terminals 71e to 74e to the switches different from each other (first switch 301 and second switch 302) makes it possible to improve the electrical isolation degree between the circuits to which the first input/output terminals 71e to 74e, likely to be used at the same time, are connected.

Figure 9:
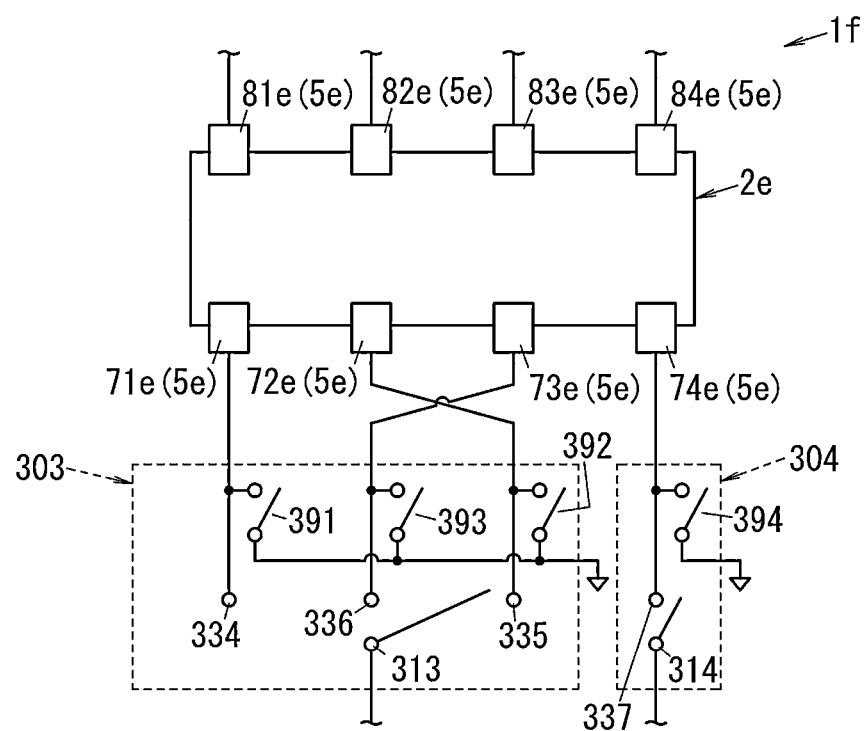
FIG. 9 is a schematic diagram of an electronic component in an electronic device according to Modification 1 of Preferred Embodiment 6 of the present invention.

As Modification 1 of Preferred Embodiment 6, an electronic device 1f may include a first switch 303 and a second switch 304 as illustrated in FIG. 9, instead of the first switch 301 and the second switch 302.

The first switch 303 changes each of the three first input/output terminals 71e to 73e to the hot terminal or the ground terminal. In more detail, the first switch 303 is electrically connected to the first input/output terminals 71e to 73e of the electronic component 2e. The first switch 303 includes a common terminal 313, three selection terminals 334 to 336, and three switching elements 391 to 393. The common terminal 313 is electrically connected to another circuit (not illustrated). The selection terminal 334 is electrically connected to the first input/output terminal 71e. Further, the selection terminal 334 is connected to the ground via the switching element 391. The selection terminal 335 is electrically connected to the first input/output terminal 72e. Further, the selection terminal 335 is connected to the ground via the switching element 392. The selection terminal 336 is electrically connected to the first input/output terminal 73e. Further, the selection terminal 336 is connected to the ground via the switching element 393.

The second switch 304 changes the first input/output terminal 74e to the hot terminal or the ground terminal. In more detail, the second switch 304 is electrically connected to the first input/output terminal 74e of the electronic component 2e. The second switch 304 includes a common terminal 314, a selection terminal 337, and a switching element 394. The common terminal 314 is electrically connected to another circuit (not illustrated). The selection terminal 337 is electrically connected to the first input/output terminal 74e. Further, the selection terminal 337 is connected to the ground via the switching element 394.

The first switch 303 selectively switches between a first state, a second state, and a third state, which will be described later. The first state is a state in which the common terminal 313 is connected to the selection terminal 334. The second state is a state in which the common terminal 313 is connected to the selection terminal 335. The third state is a state in which the common terminal 313 is connected to the selection terminal 336.

In the first state, since the common terminal 313 is connected to the selection terminal 334 connected to the first input/output terminal 71e, the first input/output terminal 71e is in the on state and defines and functions as the hot terminal. The switching element 391 is in the off state. Whereas, in the first state, the switching element 392 and 393 are in the on state. With this, the first input/output terminals 72e and 73e are connected to the ground and define and function as the ground terminals.

In the second state, since the common terminal 313 is connected to the selection terminal 335 connected to the first input/output terminal 72e, the first input/output terminal 72e is in the on state and defines and functions as the hot terminal. The switching element 392 is in the off state. Whereas, in the second state, the switching element 391 and 393 are in the on state. With this, the first input/output terminals 71e and 73e are connected to the ground and define and function as the ground terminals.

In the third state, since the common terminal 313 is connected to the selection terminal 336 connected to the first input/output terminal 73e, the first input/output terminal 73e is in the on state and defines and functions as the hot terminal. The switching element 393 is in the off state. Whereas, in the third state, the switching element 391 and 392 are in the on state. With this, the first input/output terminals 71e and 72e are connected to the ground and define and function as the ground terminals.

Incidentally, in the first state and the second state, the selection terminal 337 connected to the first input/output terminal 74e may be connected or may not be connected to the common terminal 314. When the common terminal 314 is connected to the selection terminal 337, the switching element 394 is in the off state. With this, the first input/ output terminal 74e is in the on state and defines and functions as the hot terminal. Whereas, when the common terminal 314 is not connected to the selection terminal 337, the switching element 394 is in the on state. With this, the first input/output terminal 74e is in the off state and defines and functions as the ground terminal.

Figure 10:
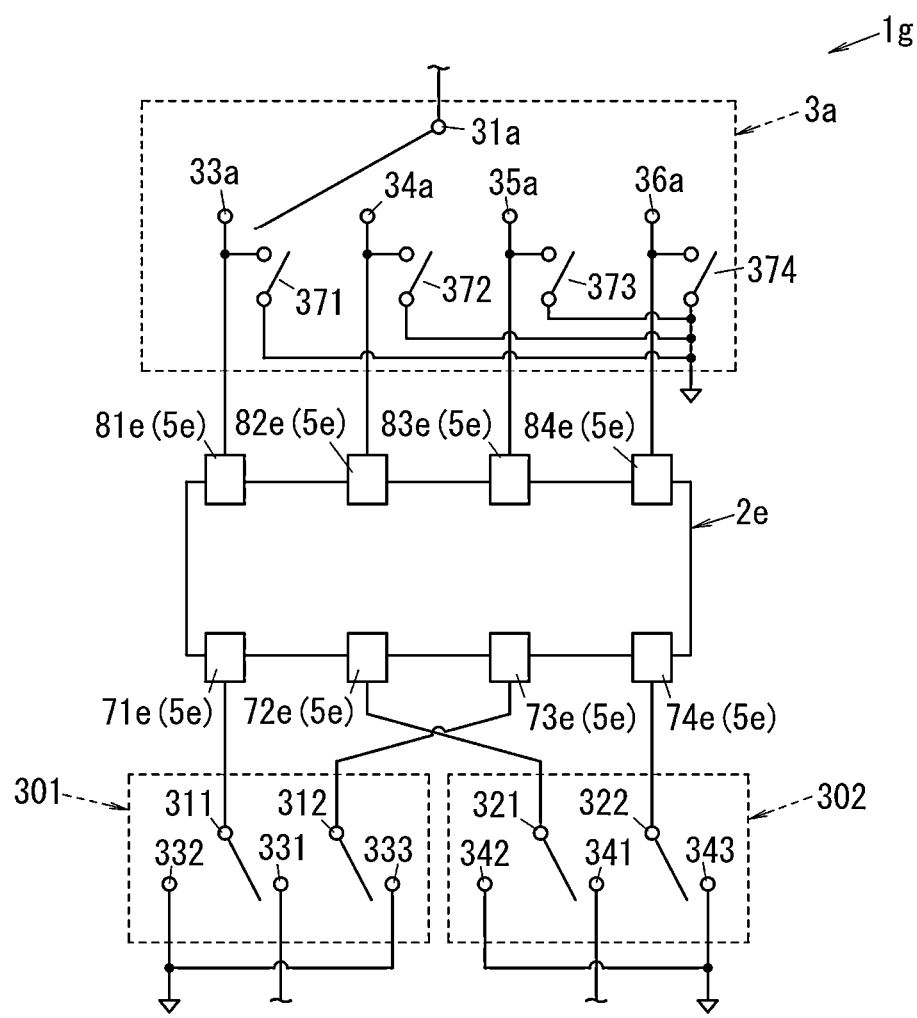
FIG. 10 is a schematic diagram of an electronic component in an electronic device according to Modification 2 of Preferred Embodiment 6 of the present invention.

As Modification 2 of Preferred Embodiment 6, an electronic device 1g may include the first switch 301 and the second switch 302, and may include the switch 3a in addition to them as illustrated in FIG. 10. The switch 3a has the same configuration and function as those of the switch 3a of Preferred Embodiment 2 (see FIG. 4). In Modification 2, the switch 3a, the first switch 301, and the second switch 302 operate together. With this, similarly to Preferred Embodiment 6, each of the four first input/output terminals 71e to 74e adjacent to one another is changed to the hot terminal in the on state, and is changed to the ground terminal in the off state. As a result, it is possible to avoid the state in which both of the two adjacent first input/output terminals among the four first input/output terminals 71e to 74e adjacent to one another are the hot terminals.

Figure 11:
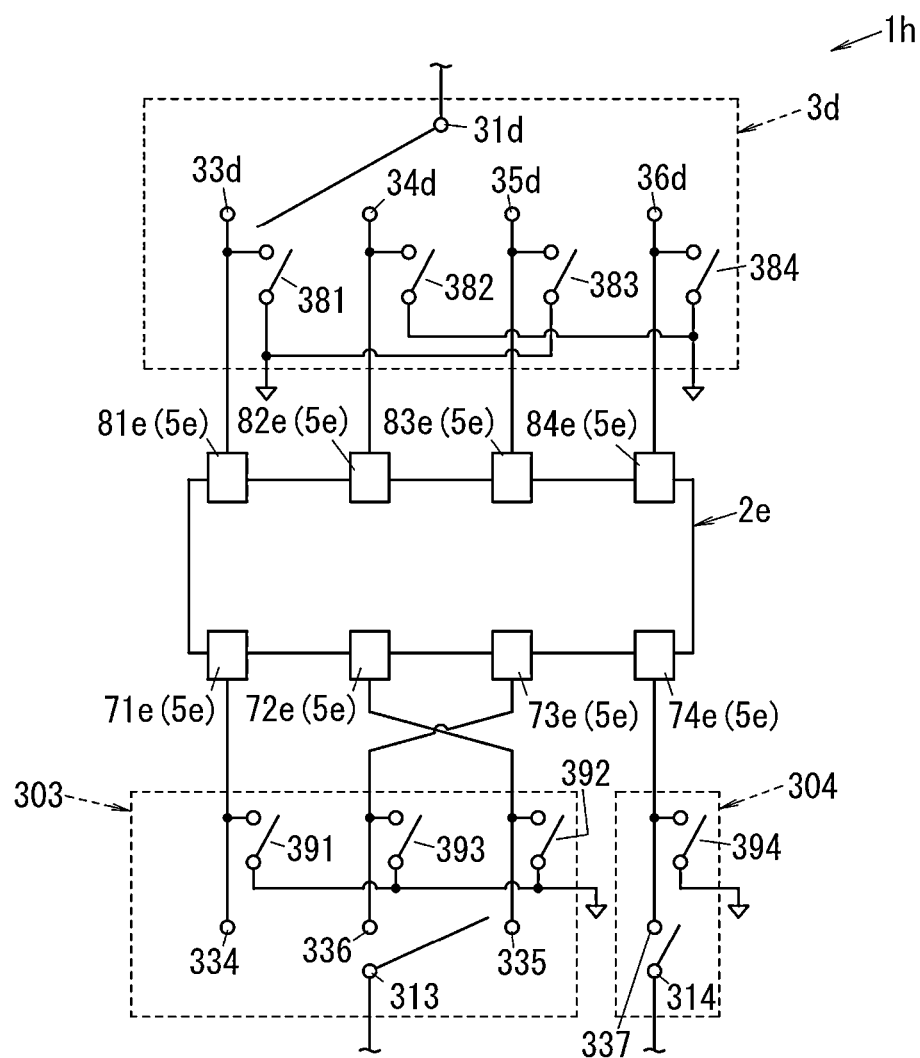
FIG. 11 is a schematic diagram of an electronic component in an electronic device according to Modification 3 of Preferred Embodiment 6 of the present invention.

As Modification 3 of Preferred Embodiment 6, an electronic device 1h may include the first switch 303 and the second switch 304 instead of the first switch 301 and the second switch 302, and may include the switch 3d in addition to them as illustrated in FIG. 11. The switch 3d has the same configuration and function as those of the switch 3d of Preferred Embodiment 5 (see FIG. 7). In Modification 3, the switch 3d, the first switch 303, and the second switch 304 operate together. With this, similarly to Preferred Embodiment 6, each of the four adjacent first input/output terminals 71e to 74e is changed to the hot terminal in the on state, and is changed to the ground terminal in the off state. As a result, it is possible to avoid the state in which both of the two adjacent first input/output terminals among the four first input/output terminals 71e to 74e adjacent to one another are the hot terminals.

Each of the electronic devices 1f to 1h according to the modifications above achieves the same effects as those of the electronic device 1e according to Preferred Embodiment 6.

The preferred embodiments and modifications described above are only some of the various preferred embodiments and modifications of the present invention. Further, the preferred embodiments and modifications may be modified in various ways depending on the design and the like as long as various advantages of the present invention may be achieved.

(Aspects)

The following aspects are disclosed in the preferred embodiments and modifications described above.

An electronic device (1) according to a first aspect of a preferred embodiment of the present invention includes an electronic component (2) and at least one switch (3). The electronic component (2) includes a plurality of circuits that function independently of one another. The switch (3) is electrically connected to the plurality of circuits. The electronic component (2) includes a base body (4) and two or more input/output terminals (5). The base body (4) includes main surfaces (first main surface 41; second main surface 42). The two or more input/output terminals (5) are provided to the main surface of the base body (4). At least one of the two or more input/output terminals (5) is electrically connected between corresponding one of the plurality of circuits and the switch (3). The two or more input/output terminals (5) include two input/output terminals adjacent to each other (first input/output terminals 71 and 72). The two input/output terminals adjacent to each other (first input/output terminals 71 and 72) are electrically connected between the switch (3) and circuits different from each other among the plurality of circuits. The switch (3) changes one of the two input/output terminals adjacent to each other (first input/output terminals 71 and 72) to the hot terminal and changes the other of the two input/output terminals adjacent to each other (first input/output terminals 71 and 72) to the ground terminal.

In the electronic device (1) according to the first aspect of a preferred embodiment of the present invention, one of the two input/output terminals adjacent to each other (first input/output terminals 71 and 72) is changed to the hot terminal, and the other of the two input/output terminals adjacent to each other (first input/output terminals 71 and 72) is changed to the ground terminal. With this, one of the two input/output terminals adjacent to each other (first input/output terminals 71 and 72) may be set to the ground terminal, and therefore, the state in which the hot terminals are adjacent to each other may be reduced even in a case that the dedicated ground terminal is not provided between the two hot terminals. As a result, the mutual interference between the circuits to which the hot terminals are connected may be reduced, and the electronic component (2) may be reduced in size in comparison with a case that the dedicated ground terminal is provided.

In the electronic device (1; 1a) according to a second aspect of a preferred embodiment of the present invention, in the first aspect, the switch (3; 3a) is a separate body from the electronic component (2; 2a).

In the electronic device (1; 1b) according to a third aspect of a preferred embodiment of the present invention, in the first aspect, the functional surface (second main surface 42; 42b) of the switch (3; 3a) and the functional surface (first main surface 41; 41b) of the plurality of circuits are provided at positions different from each other in the thickness direction of the base body (4; 4b) of the electronic component (2b).

In the electronic device (1; 1b) according to a fourth aspect of a preferred embodiment of the present invention, in the third aspect, the two or more input/output terminals (5; 5b) are terminals that electrically connect the functional surface (second main surface 42; 42b) of the plurality of circuits and the functional surface (first main surface 41; 41b) of the switch (3; 3a).

In the base body (4; 4b) of the electronic device (1; 1b) according to the fourth aspect, the functional surface of the switch (3; 3a) is provided to the second main surface (42; 42b) on the side opposite to the first main surface (41; 41b) including the functional surface of the plurality of circuits. With this, the wiring efficiency may be improved even in the second main surface (42; 42b) in which a connection portion having a size larger than the functional surface portion, such as solder, needs to be provided.

In the electronic device (1; 1b) according to a fifth aspect of a preferred embodiment of the present invention, in the fourth aspect, the base body (4; 4b) of the electronic component (2; 2b) has the first main surface (41; 41b) and the second main surface (42; 42b) opposite to each other as the main surfaces. The base body (4; 4b) of the electronic component (2; 2b) further includes a side surface (43) connecting the first main surface (41; 41b) and the second main surface (42; 42b). The two or more input/output terminals (5; 5b) are provided to the side surface (43).

In the electronic device (1; 1b) according to the fifth aspect, the side surface (43) of the base body (4; 4b) is provided with the two or more input/output terminals (5; 5b) at least one of which defines and functions as the ground terminal. This makes it possible to improve the wiring efficiency even in the side surface (43) being a limited region of the base body (4; 4b).

In the electronic device (1c) according to a sixth aspect of a preferred embodiment of the present invention, in any one of the first to fourth aspects, the electronic component (2c) includes a first chip (21) and a second chip (22) laminated in the thickness direction of the base body (4c). The first chip (21) includes the two or more input/output terminals (5c). Two (first input/output terminals 71c and 74c) of the two or more input/output terminals (5c) are electrically connected to wiring portions provided to the second chip (22).

In the electronic device (1c) according to the sixth aspect, even in a case that the electronic component (2c) includes a plurality of laminated chips (first chip 21 and second chip 22), any one of the two input/output terminals (5c) adjacent to each other may be set to the ground terminal, and this makes it possible to ensure preferable isolation.

In the electronic device (1c) according to a seventh aspect of a preferred embodiment of the present invention, in any one of the first to sixth aspects, two (first input/output terminals 71c and 74c) of the two or more input/output terminals (5c) that simultaneously define and function as hot terminals are provided at the outer ends of the main surface (second main surfaces 42c) of the base body (4c).

In the electronic device (1c) according to the seventh aspect, the two input/output terminals that simultaneously define and function as the hot terminals (first input/output terminals 71c and 74c), that is, the two input/output terminals that are simultaneously used (first input/output terminals 71c and 74c), are spaced apart from each other at the outer ends of the main surface (second main surface 42c) of the base body (4c). This makes it possible to reduce the mutual influence on the characteristics of the two circuits even when the two circuits are simultaneously used.

In the electronic device (1) according to an eighth aspect of a preferred embodiment of the present invention, in any one of the first to seventh aspects, the two input/output terminals adjacent to each other (first input/output terminals 71 and 72) are connected to the same ground in an off state.

In the electronic device (1) according to the eighth aspect, the two input/output terminals adjacent to each other (first input/output terminals 71 and 72) are connected to the same ground in the off state. With this, the electronic device (1) may be designed without taking the ground electric potential difference between the two input/output terminals adjacent to each other (first input/output terminals 71 and 72) into account.

In the electronic device (1d) according to a ninth aspect, in any one of the first to seventh aspects, a ground to which a portion of the four input/output terminals adjacent to each other (first input/output terminals 71a to 74a) is connected in an off state is different from a ground to which the remainder of the four input/output terminals adjacent to each other (first input/output terminals 71a to 74a) is connected in the off state.

In the electronic device (1d) according to the ninth aspect, the different grounds are assigned in accordance with the input/output terminals (first input/output terminals 71a to 74a), and therefore, it is possible to reduce the migration of signal components or the like via the ground wiring line even in the case that the ground line design is fragile.

In the electronic device (1e) according to a tenth aspect, in any one of the first to ninth aspects, the two or more input/output terminals (5e) include input/output terminals of a first group (first input/output terminals 71e and 73e) and input/output terminals of a second group (first input/output terminals 72e and 74e). The switch includes a first switch (301) and a second switch (302). The first switch (301) changes the input/output terminals of the first group (first input/output terminals 71e and 73e) to the hot terminal or to the ground terminal, and the second switch (302) changes the input/output terminals of the second group (first input/output terminals 72e and 74e) to the hot terminal or to the ground terminal. The first switch (301) is different from the second switch (302).

In the electronic device (1e) according to the tenth aspect, dividing the switch connected to the two or more input/output terminals (5e) into the first switch (301) and the second switch (302) makes it possible to improve the electrical isolation degree between the input/output terminals adjacent to each other.

In the electronic device (1e) according to an eleventh aspect of a preferred embodiment of the present invention, in any one of the first to ninth aspects, the two or more input/output terminals (5e) include input/output terminals of a first group (first input/output terminals 71e and 73e) and input/output terminals of a second group (first input/output terminals 72e and 74e). The switch includes a first switch (301) and a second switch (302). The first switch (301) changes the input/output terminals of the first group (first input/output terminals 71e and 73e) to the hot terminal or to the ground terminal, and the second switch (302) changes the input/output terminals of the second group (first input/output terminals 72e and 74e) to the hot terminal or to the ground terminal. The first switch (301) and the second switch (302) operate such that the two input/output terminals adjacent to each other do not change to the hot terminals at the same time.

In the electronic device (1e) according to the eleventh aspect, it is possible to avoid the state in which the input/output terminals, likely to be used as the hot terminals at the same time, are adjacent to each other. With this, the effect of using a portion of the input/output terminals as the ground terminal is further exhibited. In addition to that, connecting the input/output terminals to the switches different from each other makes it possible to improve the electrical isolation degree between the circuits to which the input/output terminals, likely to be used at the same time, are connected.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   an electronic component including a plurality of circuits that function independently of one another; and
   at least one switch electrically connected to the plurality of circuits; wherein
   the electronic component includes:
     a base body including a main surface; and
     two or more input/output terminals provided to the main surface of the base body;
   at least one of the two or more input/output terminals is electrically connected between corresponding one of the plurality of circuits and the at least one switch;
   the two or more input/output terminals include two input/output terminals adjacent to each other;

the two input/output terminals adjacent to each other are electrically connected between the at least one switch and circuits different from each other among the plurality of circuits; and the at least one switch changes one of the two input/output terminals adjacent to each other to a hot terminal and changes the other of the two input/output terminals adjacent to each other to a ground terminal.

2. The electronic device according to claim 1, wherein the at least one switch is a separate body from the electronic component.

3. The electronic device according to claim 1, wherein a functional surface of the at least one switch and a functional surface of the plurality of circuits are provided at positions different from each other in a thickness direction of the base body of the electronic component.

4. The electronic device according to claim 3, wherein the two or more input/output terminals are terminals that electrically connect the functional surface of the plurality of circuits and the functional surface of the at least one switch.

5. The electronic device according to claim 4, wherein the base body of the electronic component includes:
a first main surface and a second main surface opposite to each other as the main surface; and
a side surface connecting the first main surface and the second main surface; wherein
the two or more input/output terminals are provided on the side surface.

6. The electronic device according to claim 1, wherein
the electronic component includes a first chip and a second chip laminated in a thickness direction of the base body;
the first chip includes the base body and the two or more input/output terminals; and
two of the two or more input/output terminals are electrically connected to wiring portions provided to the second chip.

7. The electronic device according to claim 1, wherein two of the two or more input/output terminals that simultaneously define and function as hot terminals are provided at outer ends of the main surface of the base body.

8. The electronic device according to claim 1, wherein the two input/output terminals adjacent to each other are connected to a same ground in an off state.

9. The electronic device according to claim 1, wherein a ground to which a portion of the two input/output terminals adjacent to each other is connected in an off state is different from a ground to which the remainder of the two input/output terminals adjacent to each other is connected in the off state.

10. The electronic device according to claim 1, wherein
the two or more input/output terminals include an input/output terminal of a first group and an input/output terminal of a second group;
the at least one switch includes a first switch to change the input/output terminal of the first group to the hot terminal or to the ground terminal and a second switch to change the input/output terminal of the second group to the hot terminal or to the ground terminal; and
the first switch is different from the second switch.

11. The electronic device according to claim 1, wherein
the two or more input/output terminals include an input/output terminal of a first group and an input/output terminal of a second group;
the at least one switch includes a first switch to change the input/output terminal of the first group to the hot terminal or to the ground terminal and a second switch to change the input/output terminal of the second group to the hot terminal or to the ground terminal; and
the first switch and the second switch operate such that the two input/output terminals adjacent to each other do not change to the hot terminals at the same time.

12. The electronic device according to claim 1, wherein the electronic device is configured to perform radio frequency signal processing.

13. The electronic device according to claim 1, further comprising a wiring substrate defining a motherboard of the electronic device or a wiring structure.

14. The electronic device according to claim 1, wherein the electronic component is a filter, an integrated circuit, or an acoustic wave component.

15. The electronic device according to claim 1, wherein the two or more input/output terminals include two first input/output terminals and one second input/output terminal.

16. The electronic device according to claim 15, wherein a ground terminal is between one of the two first input/output terminals and the one second input/output terminal.

17. The electronic device according to claim 13, wherein the electronic component is mounted on the wiring substrate and the at least one switch is mounted on the wiring substrate adjacent to the electronic component.

18. The electronic device according to claim 1, wherein the electronic component and the at least one switch are integrated in a chip.

19. The electronic device according to claim 1, wherein the two or more input/output terminals include an equal number of first input/output terminals and second input/output terminals.

20. The electronic device according to claim 1, wherein a plurality of ground terminals equal in number to the number of first input/output terminals and second input/output terminals are provided between the first input/output terminals and the second input/output terminals.

* * * * *